(12) United States Patent
James et al.

(10) Patent No.: US 9,907,209 B1
(45) Date of Patent: Feb. 27, 2018

(54) HEAT SINK RETENTION SPRING CLIP

(71) Applicant: Verizon Patent and Licensing Inc., Arlington, VA (US)

(72) Inventors: Gregory A. James, Phoenix, AZ (US); Steve S. Chen, Milpitas, CA (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 0 days.

(21) Appl. No.: 15/243,279

(22) Filed: Aug. 22, 2016

(51) Int. Cl.
*H05K 7/20* (2006.01)
*F16B 2/24* (2006.01)
*H05K 1/02* (2006.01)

(52) U.S. Cl.
CPC ........... *H05K 7/2039* (2013.01); *F16B 2/248* (2013.01); *H05K 1/0203* (2013.01); *H05K 2201/066* (2013.01)

(58) Field of Classification Search
CPC .............................. H05K 7/2039; F16B 2/248
USPC ......................................... 361/720, 719, 704
See application file for complete search history.

(56) References Cited

U.S. PATENT DOCUMENTS

| | | | | |
|---|---|---|---|---|
| 5,331,507 A * | 7/1994 | Kyung | ................ | H01L 23/4093 174/16.3 |
| 7,639,501 B2 * | 12/2009 | Wang | .................. | H01L 23/4093 165/80.3 |
| 2003/0015343 A1 * | 1/2003 | Chen | .................... | H01L 23/4093 174/252 |
| 2008/0101030 A1 * | 5/2008 | Li | ........................ | H01L 23/4093 361/719 |
| 2009/0323289 A1 * | 12/2009 | He | ....................... | H01L 23/3672 361/720 |

* cited by examiner

*Primary Examiner* — Dion R Ferguson
*Assistant Examiner* — Mandeep S Buttar

(57) ABSTRACT

A retaining clip is provided for use with a heat sink. The heat sink has a flat bottom surface in heat conducting engagement with an electronic device and fins extending from a top surface of the heat sink, the fins defining a channel. The retainer clip includes a middle section and a first end section and a second end section on either side of the middle section. The middle section fits within the channel and engages the heat sink to hold the bottom surface against the electronic device. The middle section further includes a portion extending above the top surface, within the channel, to limit rotation of the heat sink. Each of the first and second end sections include a pivot end adjacent to the middle section, a distal end to engage an anchor, a first leg adjacent to the distal end, a second leg adjacent to a pivot end, and a bend between the first leg and the second leg, the bend located to form a moment arm from the pivot end.

20 Claims, 11 Drawing Sheets

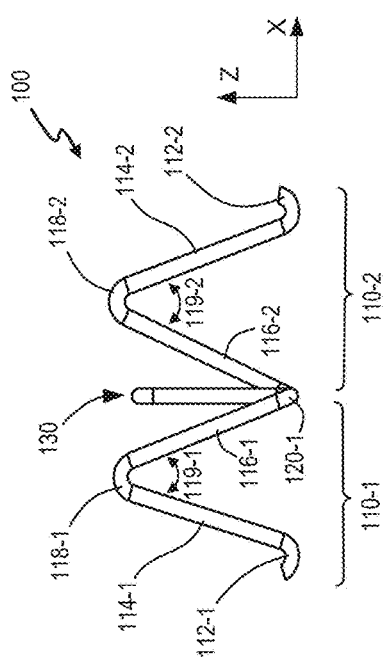
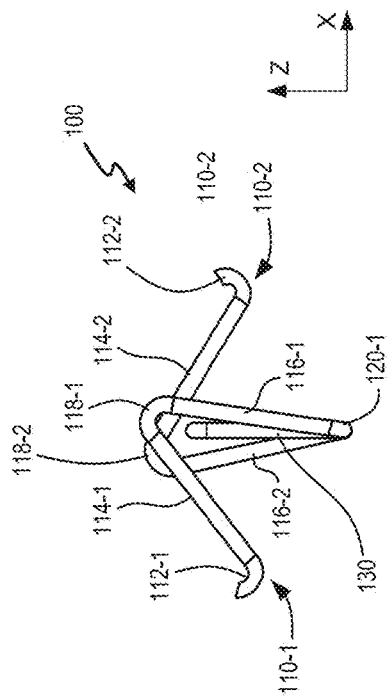
FIG. 2C
FIG. 2D

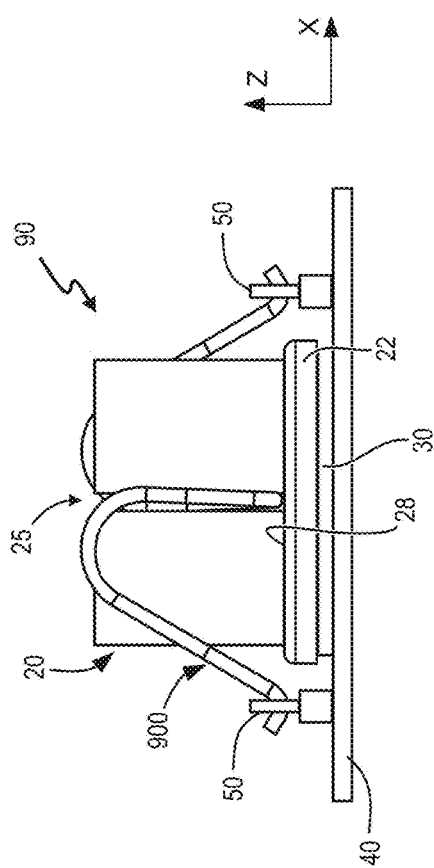
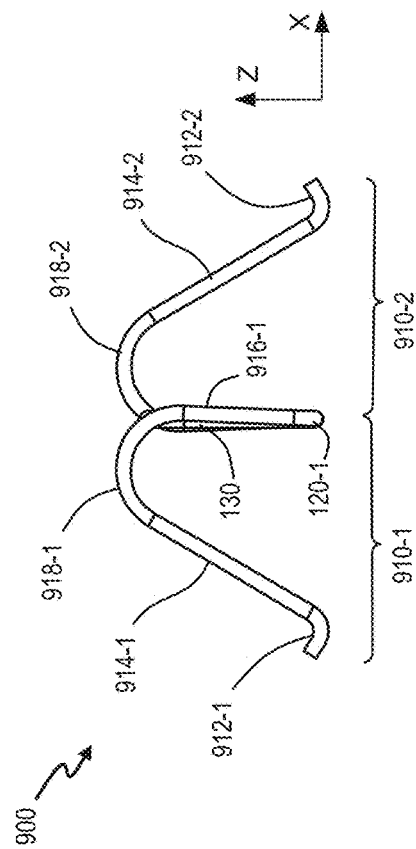

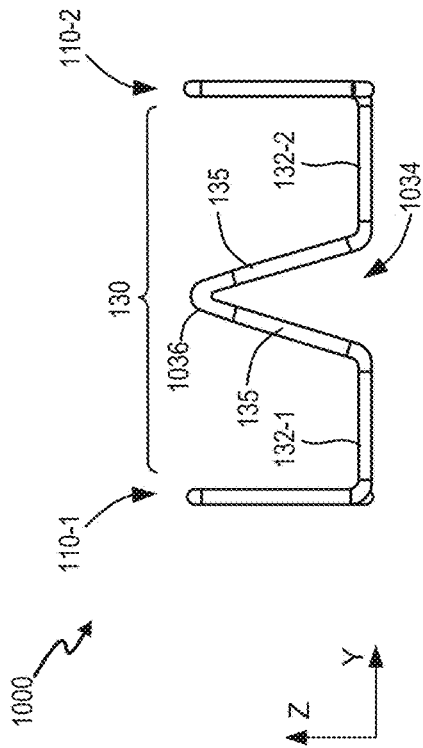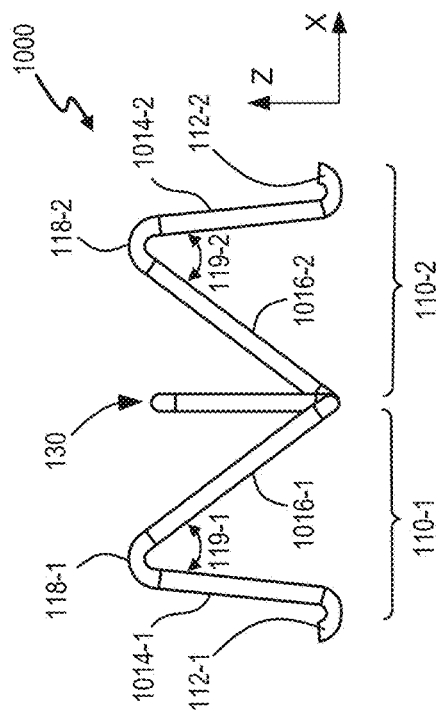

HEAT SINK RETENTION SPRING CLIP

BACKGROUND

Electronic devices, such as integrated circuit (IC) chip packages, are well known and commonly used to perform a variety of electronic functions. In use, it has been found that some electronic devices often produce a significant level of heat that is not adequately removed by either natural air convection or by powered ventilation, such as a fan. As a consequence, various methods have been employed to assist in cooling electronic devices.

One well-known method for cooling IC chip packages, for example, involves convection cooling in which a heat sink is mounted to a surface of the IC chip package. In mounting the heat sink, it is not desirable to use a bonding process, such as an adhesive, because of the permanent nature of such attachment. For example, a malfunctioning semiconductor device may be discarded, and it is not desirable to discard the heat sink too. It has therefore been found desirable to attach the heat sink to the IC chip package by mechanical means such as a retainer clip. A typical heat sink has a flat surface generally the same size as the IC chip package, with a plurality of radiation fins projecting substantially perpendicularly from a surface of the heat sink. The heat sink is commonly fabricated from a material having a high thermal conductivity, such as aluminum. The protruding fins assist in transporting thermal energy away from the IC chip package by providing a relatively large surface area for convective heat.

BRIEF DESCRIPTION OF THE DRAWINGS

FIG. 2C is a side view of the retaining clip of FIG. 1;

FIG. 2D is a side view of the retaining clip of FIG. 1 in a relaxed state;

FIG. 9A is a side view of an assembly including the heat sink, the electronic device, and the retaining clip installed on the substrate according to another implementation described herein;

FIG. 9B is a side view of the retaining clip of FIG. 9A;

FIG. 10A is a front view of a retaining clip in an installed state according to still another implementation; and FIG. 10B is a side view of the retaining clip of FIG. 10A.

DETAILED DESCRIPTION OF THE PREFERRED EMBODIMENTS

The following detailed description refers to the accompanying drawings. The same reference numbers in different drawings may identify the same or similar elements. Drawings are illustrative and not drawn to scale.

Systems described herein include a retaining clip that maintains a position of a heat sink relative to an electronic device on a printed circuit board (PCB). The retaining clip may be installed between fins of the heat sink and prevent tilting or rotation of the heat sink along three different axes (referred to herein as an x-axis, a y-axis, and a z-axis). As described further herein, the retaining clip utilizes two anchor points and can be installed with minimal forces using manual or automated techniques. The retaining clip can be manufactured, for example, from inexpensive spring steel wire using a simple high-speed bend-and-clip process.

Figure 1:
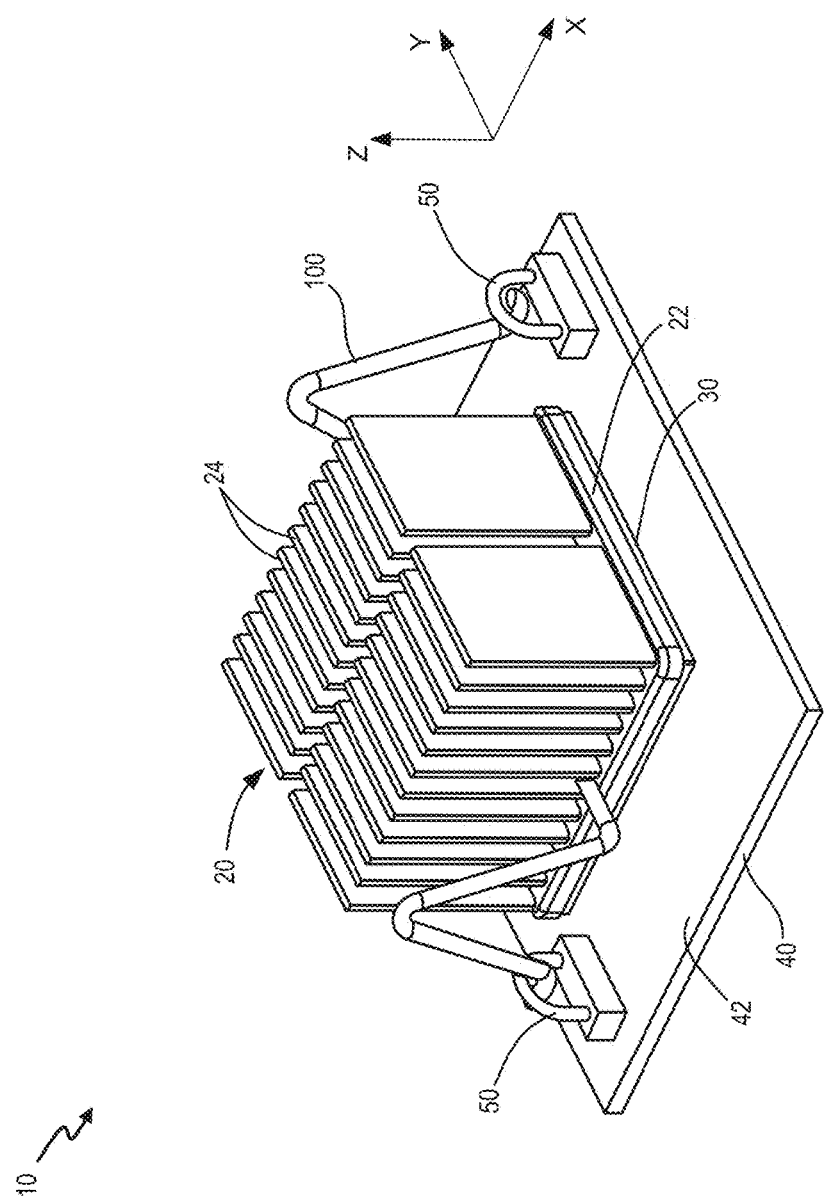
FIG. 1 is a perspective view of an assembly including a heat sink, an electronic device, and a retaining clip installed on a substrate according to an implementation described herein.

FIG. 1 is a perspective view of an assembly 10 including a heat sink 20, an electronic device 30 (e.g., a packaged integrated circuit (IC)), a substrate 40 (e.g., a printed circuit board), and a retaining clip 100. Heat sink 20 may include a plate 22 from which a multiple fins 24 (or pins) extend. As shown in the assembled configuration of FIG. 1, heat sink 20 may be assembled with electronic device 30 coupled to substrate 40 and heat sink 20 placed upon (and in contact with) electronic device 30. Heat sink 20 may be thermally coupled to a top surface of the electronic device 30 by retaining clip 100, the ends of which are engaged with anchors 50 that are mounted to a top surface 42 of substrate 40.

As further shown in FIG. 1, a portion of retaining clip 100 may fit in a space between fins 24 to engage plate 22 of heat sink 20. When the ends of retaining clip 100 are secured to anchors 50, retaining clip 100 provides a spring bias force to the heat sink 20 relative to substrate 40, thereby forcing a bottom surface of plate 22 into contact with a top surface of electronic device 30.

Heat sink 20 may be manufactured from a material having high thermal conductivity (such as aluminum, copper, etc.) to allow for efficient conduction of heat from electronic device 30 to heat sink 20. Heat is subsequently conducted through heat sink plate 22 to fins 24 and transferred to the surrounding environment by convection and radiation.

Electronic device 30 may include a semiconductor device with at least one thermally conductive surface. Electronic device 30 may include a cartridge, a housing, a module, etc. with a top surface made of metal or another high heat-conducting material to engage or interface with heat sink 20 for dissipating heat from the semiconductor device. In some implementations, a conductive aid may be applied to the top surface of the electronic device 30. The conductive aid may form a thermally efficient contact between a top surface of electronic device 30 and a bottom surface of heat sink plate 22. Suitable materials for the conductive aid include, for example, thermal conductive grease, soft metallic foil, and metal-impregnated paste.

Substrate 40 may include a printed circuit board, socket, or other surface to which electronic device 30 and anchors 50 may be mounted. In some implementations, multiple sets of electronic devices 30 and anchors 50 may be mounted to a single substrate 40.

Anchor 50 may include any type of device that is secured to or integral with substrate 40 to accept an end of retaining clip 100. In one implementation, anchor 50 may include a structure with a loop, ring, arch, hole, or the like that extends above substrate 40 to receive an end of retaining clip 100. Anchor 50 may be secured to substrate 40 via a weld, adhesive, mechanical fasteners (e.g., rivet, clip, screw, tabs, etc.), or other techniques. Anchor 50 may be formed of metal, plastic, or another suitable material. In another implementation, substrate 40 and anchor 50 may be an integral piece. For example, anchor 50 may take the form of an eyelet or grommet through substrate 40. Anchor 50 may be secured or formed in a manner to counter a required downward load on heat sink 20 that is exerted by spring forces of retaining clip 100. In one implementation, the combined upward pull weight on two anchors 50 (e.g., exerted by an installed retaining clip 100) may be about 2.5 kilogram-force (kgf).

Retaining clip 100 generally functions to hold a bottom surface of heat sink 20 in thermal contact with a top surface of electronic device 30. Retaining clip 100 may be removably coupled to anchors 50. In one implementation, retaining clip 100 may for made from a metal wire, such as a spring steel wire or stainless steel wire. Retaining clip 100 may be formed, for example, using a high-speed bend-and-clip process. In other implementations, retaining clip 100 may be molded or cast using steel, plastic, or another material. Specific features of retaining clip 100 are described further in connection with FIGS. 2-6 below.

Figure 2A:
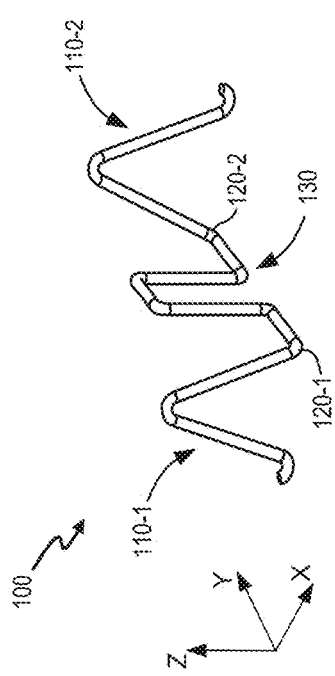
FIG. 2A is a perspective view of the retaining clip of FIG. 1.
Figure 2B:
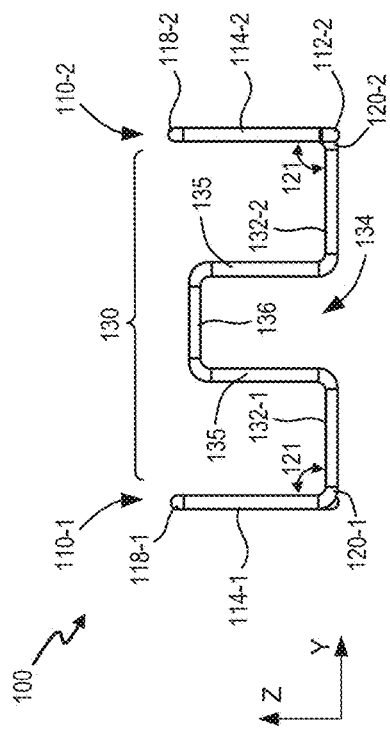
FIG. 2B is a front view of the retaining clip of FIG. 1.

FIGS. 2A-2C provide a perspective view, front view, and side view, respectively, of retaining clip 100 in an installed (or tensioned) state. FIG. 2D is a side view of the retaining clip of FIG. 1 in a relaxed (non-tensioned) state. Retaining clip 100 includes end sections 110-1 and 110-2 (referred to herein generically as "end section 110") on either side of a middle section 130. Each of end sections 110 may connect to middle section 130 at a pivot end 120-1 and 120-2 (referred to herein generically as "pivot end 120"). Each end section 110 may include a securing hook 112 (i.e., securing hook 112-1 or 112-2), a distal leg 114 (i.e., distal leg 114-1 or 114-2), a proximal leg 116 (i.e., proximal leg 116-1 or 116-2), and a bend 118 (i.e., bend 118-1 or 118-2) between distal leg 114 and proximal leg 116. Middle section 130 may include contact legs 132-1 and 132-2 (referred to herein generically as "contact legs 132") with an elevated portion 134 in between.

Figure 3:
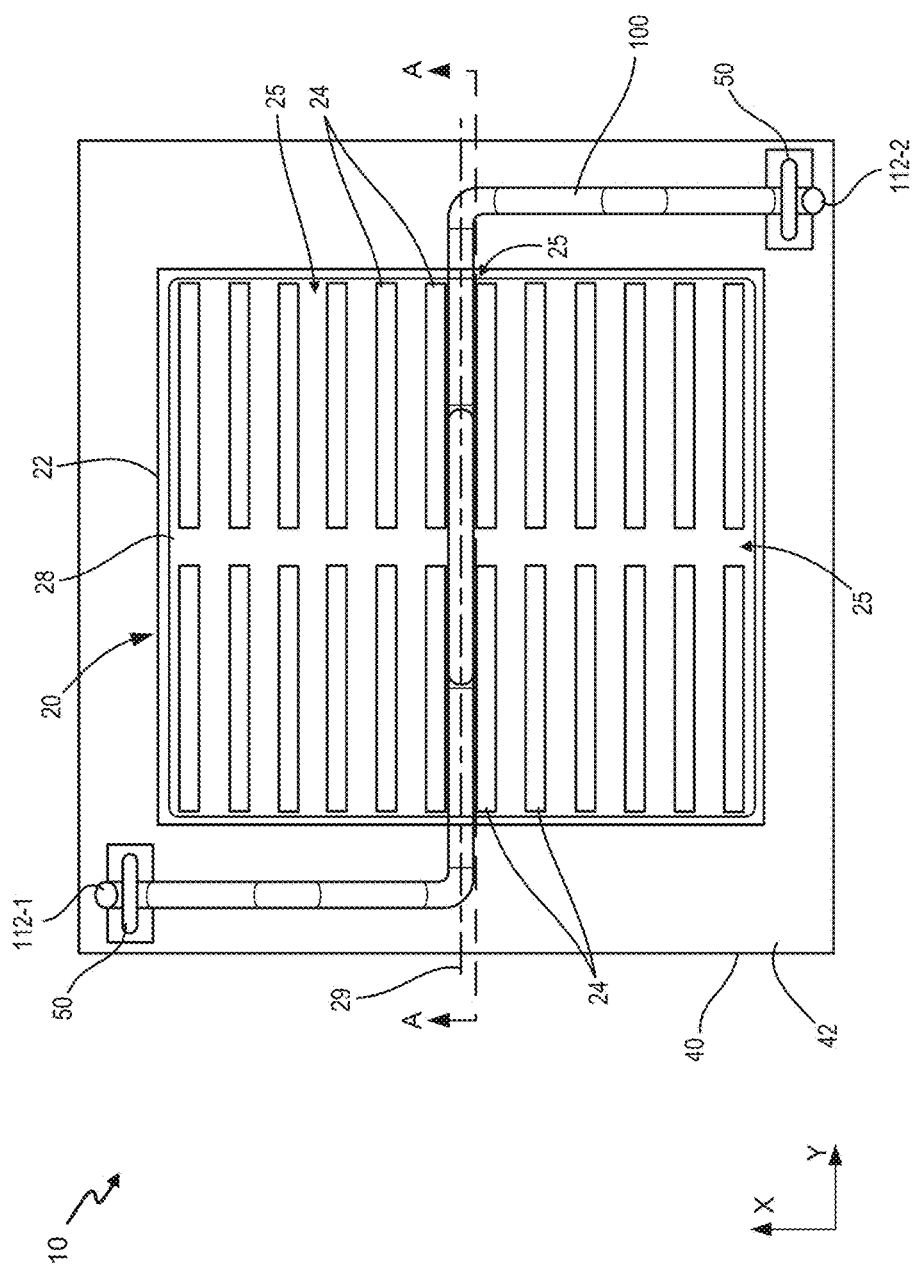
FIG. 3 is a top view of the assembly of FIG. 1.
Figure 4:
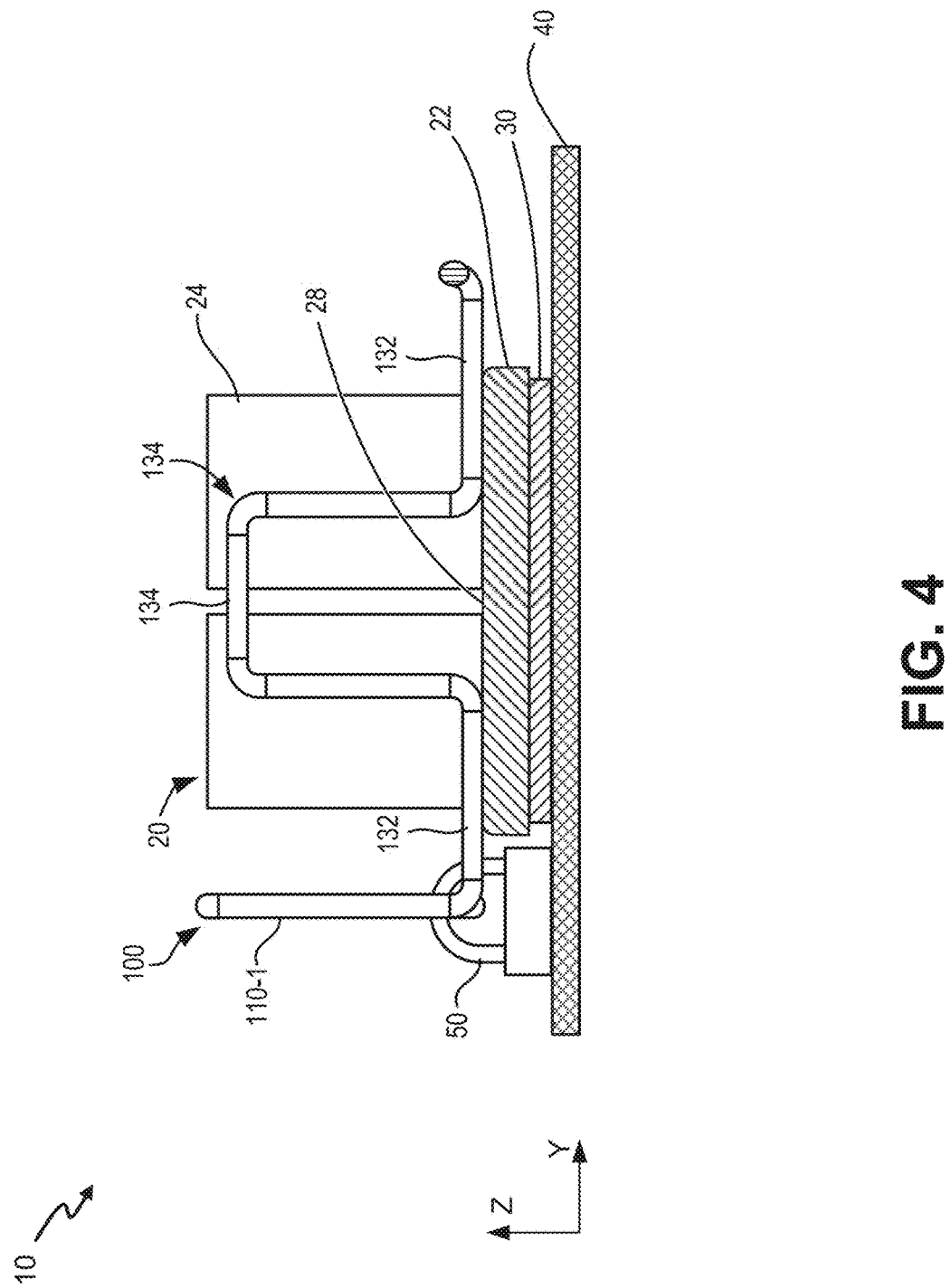
FIG. 4 is a side cross-section view of the assembly of FIG. 1.
Figure 5:
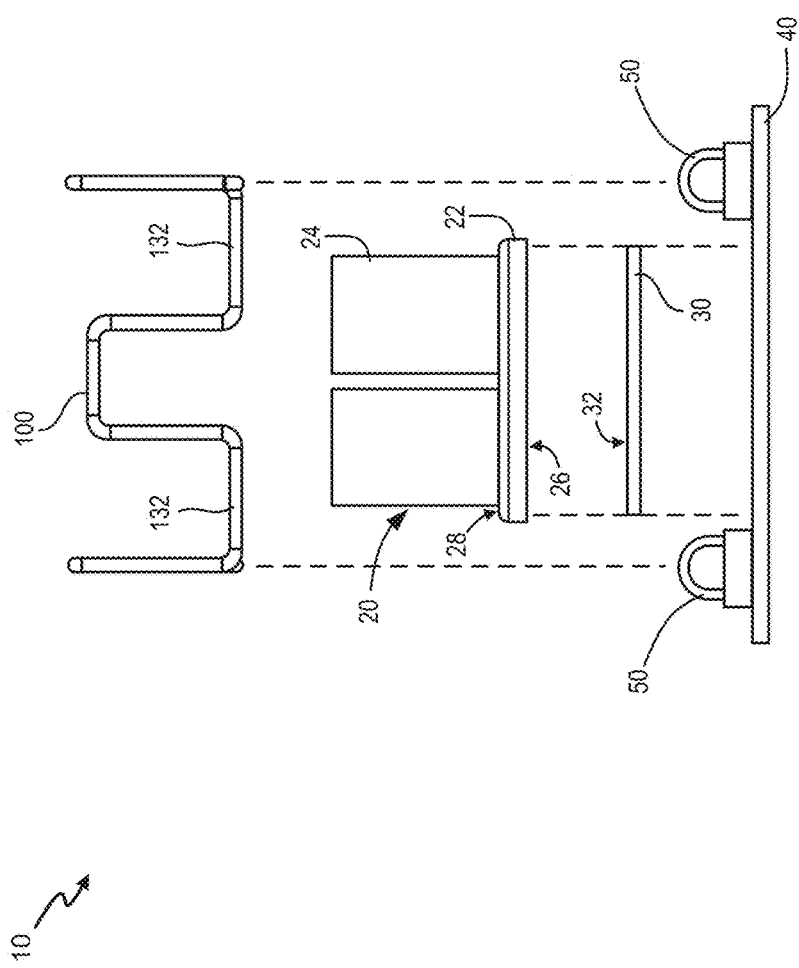
FIG. 5 is an exploded front view of the assembly of FIG. 1.
Figure 6:
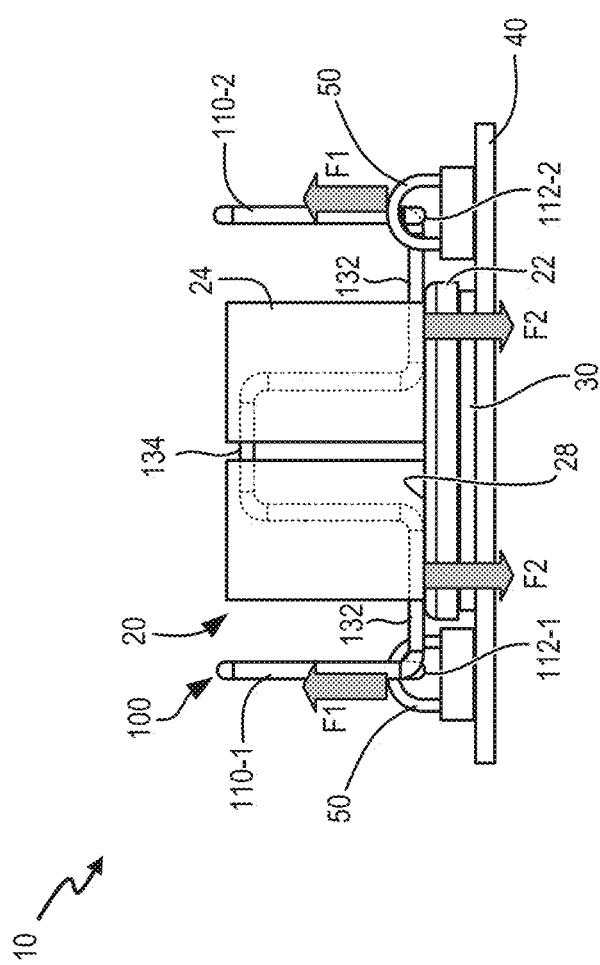
FIG. 6 is an assembled front view of the assembly of FIG. 1.

FIG. 3 is a top view of assembly 10, and FIG. 4 is a cross-sectional front view of assembly 10 along section A-A of FIG. 3. FIG. 5 provides an exploded front view of assembly 10, and FIG. 6 is an assembled front view of assembly 10 showing applied forces. Referring collectively to FIGS. 1-6, proper positioning of heat sink 20 relative to electronic device 30 is needed for proper heat dissipation in assembly 10. For optimal thermal efficiency, electronic device 30 is preferably centered under plate 22 of heat sink 20, with a top surface 32 of electronic device 30 in full contact with a bottom surface 26 of plate 22. As described further herein, after bottom surface 26 of heat sink 20 is forced into contact with top surface 32 of electronic device 30 by retaining clip 100, retaining clip 100 prevents forces that occur after installation (such as mechanical shock, shaking, vibration, and other shipping/handling conditions), from causing undesired shifting or rotation of the heat sink 20 relative to electronic device 30.

As shown, for example, in FIG. 3, fins 24 of heat sink 20 are arranged on a top surface 28 of plate 22 to form one or more channels 25 across heat sink 20. Channels 25 may be parallel or perpendicular to fins 24. Middle section 130 of retaining clip 100 may be positioned within one of the channels 25 to span heat sink 20 and contact top surface 28. Although retaining clip 100 is shown herein with a configuration to fit in a middle channel 25, in other implementations asymmetrical end sections 110 may be used to enable retaining clip 100 to be installed in other channels 25.

Two anchors 50 are installed on substrate 40 near opposite corners of plate 22. When securing hooks 112 of retaining clip 100 are engaged with anchors 50, contact legs 132 of retaining clip 100 exert a downward force on top surface 28. As shown, for example, in FIGS. 4 and 7, elevated portion 134 of retaining clip 100 extends upward (along a z-axis) within channel 25. On either end of channel 25, end portions 110 of retaining clip 100 extends in opposite directions (along different x-axes) toward respective anchors 50 and include elevated (along a z-axis) bends 118 between middle section 130 and each securing hook 112. Thus, retaining clip 100 may be configured as a one-piece spring clip to simultaneously perform multiple functions including: (1) retaining downward pressure of heat sink 20 on top of electronic device 30 to facilitate cooling; (2) maintaining the position of heat sink 20 so as to prevent heat sink 20 from rotating about the z-axis relative to electronic device 30; (3) maintaining the position of heat sink 20 so as to prevent heat sink 20 from rotating (tilting) about the x-axis and y-axis relative to electronic device 30; (4) minimizing the amount of surface area on substrate 40 required for retention by utilizing only two anchor points; and (5) minimizing forces required to install retaining clip 100.

In the configuration shown in FIGS. 1-6, the securing hook 112, distal leg 114, proximal leg 116, and bend 118 of each end section 110 of retaining clip 100 may be included within a single plane. Similarly, contact legs 132-1 and 132-2 and elevated portion 134 of middle section 130 may be included within a different single plane. The planes for each end section 110 may generally be perpendicular to the planes for middle section 130. Also, end section 110-1 and end section 110-2 are substantially on opposite sides of the vertical plane defined by middle section 130.

Figure 7:
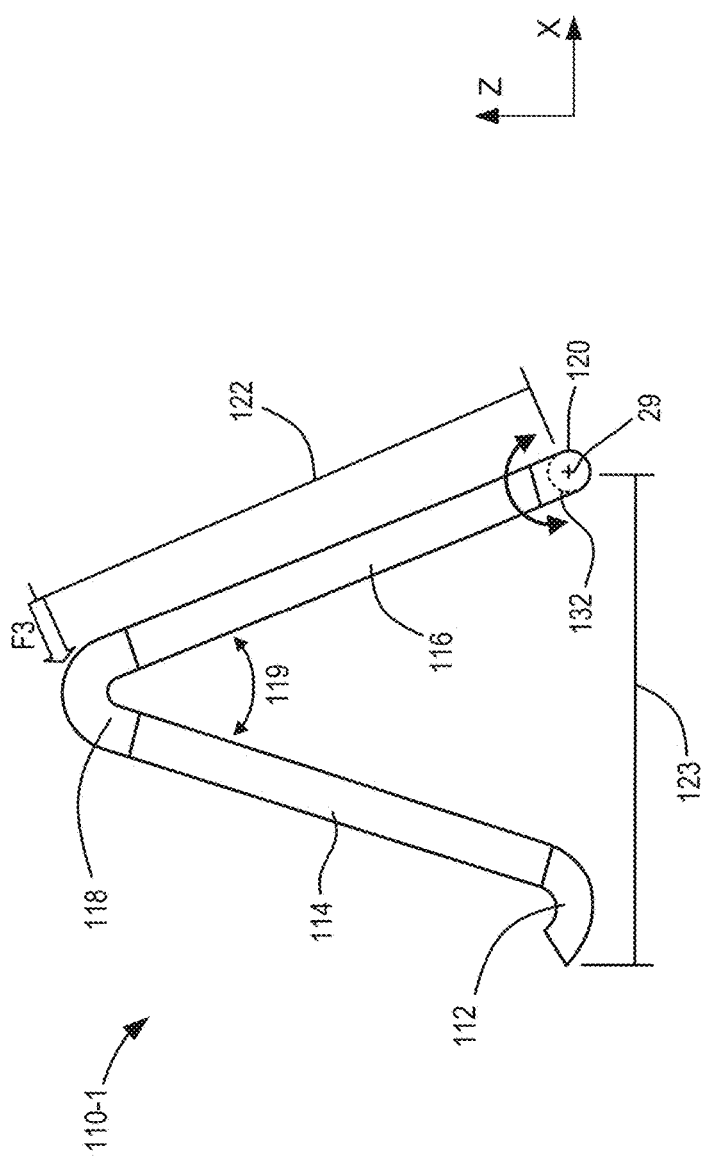
FIG. 7 is an enlarged view of an end section of the retaining clip of FIG. 1.

FIG. 7 provides an enlarged view of end section 110-1 of retaining clip 100. End section 110-2 may be configured similarly and oriented in an opposite direction. Referring collectively to FIGS. 1-7, securing hook 112, at the end of distal leg 114 of each end section 110, may engage one of anchors 50 to secure retaining clip 100 against heat sink 20. In one implementation, each end section 110 may be spring biased upward (e.g., clockwise in FIG. 7) at pivot end 120, requiring downward rotation (e.g., counter clockwise in FIG. 7) of end section 110-1 around pivot end 120 (and contact leg 132) to secure hook 112 to anchor 50. The spring bias at each pivot end 120 may cause substantially upward forces, F1 (FIG. 6), to be applied by hooks 112 onto anchors 50. Resulting downward forces, F2 (FIG. 6), may be applied to heat sink 20 (e.g., surface 28) by contact legs 132 when both of hooks 112 are coupled to respective anchors 50.

The required force to cause rotation of end sections 110 for installation of securing hook 112 against anchor 50 is minimized when forces are applied to end section 110 as far as possible from pivot end 120. According to an implementation, bend 118 may be located between distal leg 114 and proximal leg 116 to form a moment arm 122 (FIG. 7) from pivot end 120 to bend 118 for an applied force, F3. In this implementation, moment arm 122 is longer than the distance 123 (FIG. 7) between securing hook 112 and pivot end 120. For example, the axial length for proximal leg 116 may be longer than the distance between pivot end 120 and securing hook 112 when retaining clip 100 is in a secured state. Thus, less force (F3) may be required to install each end section 110 of retaining clip 100 than would be required for a clip with a straight arm between a pivot end and securing hook. Additionally, the location of bend 118/moment arm 122 may provide more accessible location to apply force F3 in tight spaces (e.g., at bend 118, instead of near securing hook 112 if a straight arm was used).

Bend 118 is biased to extend securing hook 112 beyond anchor 50 (e.g., along an x-axis) when middle section is placed within channel 25 in an unsecured state. Thus, an angle 119 between distal leg 114 and proximal leg 116 at bend 118 may be larger when retaining clip 100 is in an unsecured state and smaller when retaining clip 100 is secured to anchor 50. To attach securing hook 112 to anchor 50, distal leg 114 and proximal leg 116 are forced toward each other (e.g., pinched) to reduce angle 119 until securing hook 112 (at the end of distal leg 114) can be positioned against a portion of anchor 50 such that the bias of bend 118 and/or pivot end 120 causes securing hook 112 to push upwards against anchor 50. In one implementation, the pinching force may be applied by anchor 50 against a bottom portion of securing hook 112 in response to force F3, until end section 110 rotates to the extent that securing hook 112 snaps into place under anchor 50. Angle 119 may generally be an acute angle that opens toward substrate 40 when retaining clip 100 is secured to anchor 50. The length of distal leg 114 and proximal leg 116 provide leverage to easily squeeze distal leg 114 and proximal leg 116 about bend 118.

The required force to squeeze distal leg 114 and proximal leg 116 for installation of securing hook 112 in anchor 50 is minimized when forces are applied to end section 110 as far as possible from bend 118. Thus, in one implementation, an axial length for each of distal leg 114 and proximal leg 116 is as long as, or longer than, the height of fins 24 above surface 28. For example, bend 118 may be located at least as high as the top of heat sink 20 (i.e., fins 24) to allow for maximum length of distal leg 114 and proximal leg 116 without significantly increasing the overall height of assembly 10. In another implementation, the height of bend 118 exceeds the height of fins 24 when retaining clip 100 is installed in channel 25. In other implementations, end section 110 may be configured with shorter lengths for distal leg 114 and/or proximal leg 116, so that bend 118 is positioned to at least half the height of fins 24 when retaining clip 100 is secured to anchor 50.

Each pivot end 120 may include a bend that generally forms an angle 121 between proximal leg 116 and contact leg 132. In one embodiment, angle 121 may be about 90 degrees, so that a vertical plane including distal leg 114, proximal leg 116, and bend 118 is essentially orthogonal to contact leg 132 (and/or an axis 29 along channel 25 on surface 28). Thus, contact leg 132 may serve as an axle for rotation of end section 110 at pivot end 120. In other embodiments, angle 121 may be larger or smaller than 90 degrees. A dimension significantly larger than 90 degrees at angle 121 may increase the overall width of assembly 10. A dimension significantly smaller than 90 degrees at angle 121 may cause end section 110 to contact fins 24.

Middle section 130 may be configured to fit within channel 25 and engage surface 28 of heat sink 20. Thus, the material thickness (e.g., wire diameter) of retaining clip 100 at middle section 130 is smaller than a width of channel 25 (as defined by the spacing of fins 24). In one implementation, the wire diameter of retaining clip 100 may be approximately 1.2 mm. When retaining clip 100 is secured to anchors 50, contact legs 132 may apply force to top surface 28 and, thus, hold bottom surface 26 of heat sink 20 in thermal contact with surface 32 of electronic device 30. In one implementation, the force exerted by an installed retaining clip 100 on to top surface 28 may be at least 2.5 kgf. The orientation of contact legs 132 (particularly the axial length of contact legs 132 and/or multiple contact legs 132 within channel 25) against top surface 28 prevents or limits rotation of heat sink 20 about the x-axis.

Elevated portion 134 of middle section 130 may extend above (in the z-axis direction) contact legs 132 and top surface 28. In the embodiment of FIGS. 2A-2C, elevated portion 134 includes vertical legs 135 and cross-piece 136 in generally the same vertical plane. In other embodiments, elevated portion 134 may include a different bent wire configuration that extends above contact legs 132. Elevated portion 134 may prevent or limit rotation of heat sink 20 about the y-axis. More particularly, when retaining clip 100 is secured within channel 25, the fins 24 adjacent to elevated portion 134 may contact elevated portion 134 to prevent tilting about the y-axis. In one implementation, elevated portion 134 may extend vertically to at least one-half the height of fins 24.

Figure 8:
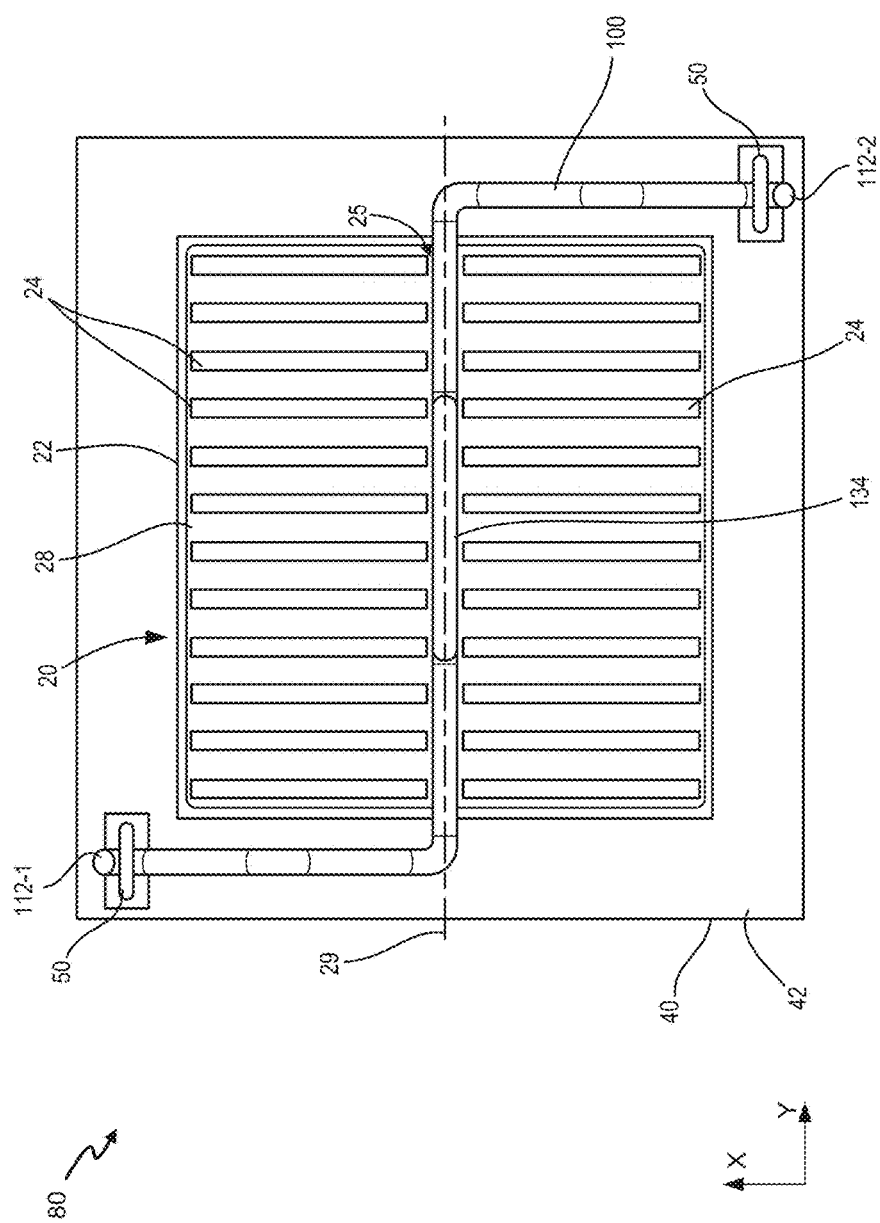
FIG. 8 is a top view of an assembly including the heat sink, the electronic device, and the retaining clip installed on the substrate according to another implementation described herein.

FIG. 8 provides a top view of an assembly 80 including heat sink 20, electronic device 30, and retaining clip 100 installed on substrate 40 according to another implementation. In the configuration of FIG. 8, heat sink 20 is rotated 90 degrees, so that retaining clip 100 is installed within a channel 25 that extends perpendicular to fins 24. Thus, elevated portion 134 may contact edges of fins 24 to limit titling of heat sink 20 along a y-axis.

FIG. 9A provides a side view of an assembly 90 including heat sink 20, electronic device 30, and a retaining clip 900 installed on substrate 40 according to still another implementation. In the configuration of FIG. 9A, retaining clip 900 is installed within a channel 25 that extends perpendicular to fins 24, similar to the configuration of assembly 80. FIG. 9B provides a side view of retaining clip 900 in an installed (or tensioned) state.

Retaining clip 900 includes end sections 910-1 and 910-2 (referred to herein generically as "end section 910") on either side of a middle section 130. Although not shown in detail in FIG. 9B, middle section 130 may be configured similarly to middle section 130 of retaining clip 100 with a contact legs 132-1 and 132-2 and an elevated portion 134 in between contact legs 132. Also similarly to retaining clip 100, each of end sections 910 may connect to middle section 130 at a pivot ends 120-1 and 120-2.

Each end section 910 may include a securing hook 912, a distal leg 914, a proximal leg 916, and a bend 918 between distal leg 914 and proximal leg 916. Bend 918 may include a comparatively larger radius than, for example, bend 118 of retaining clip 100. In one implementation, to accommodate the larger bend radius of bend 918, lengths of a distal leg 914 and proximal leg 916 in end sections 910 may be of different lengths from each other. For example, proximal leg 916 may be shorter than distal leg 914. In another example, proximal leg 916 may be curved (or eliminated) such that distal leg 914 is joined to pivot end 120 by a continuous radius of bend 918. Additionally, in contrast with end sections 110 of retaining clip 100, end section 910-1 and end section 910-2 may not be installed completely on opposite sides of a vertical plane defined by middle section 130. For example, as shown in FIG. 9A, proximal leg 916 may not rotate past a vertical plane of channel 25, when securing hook 912 is installed against anchor 50.

FIGS. 10A and 10B provide a front view and side view, respectively, of a retaining clip 1000 in an installed (or tensioned) state, according to another implementation. Retaining clip 1000 may be configured similarly to retaining clip 100, with end sections 110 and middle section 130. However, as shown in FIG. 10A, an elevated portion 1034 in middle section 130 of retaining clip 1000 may include a bend 1036 instead of cross-piece 136 used in retaining clip 100. Thus, retaining clip 1000 may include fewer bends than retaining clip 100. Referring to FIG. 10B, lengths of a distal leg 1014 and proximal leg 1016 in end sections 110 may be of different lengths from each other. For example, proximal leg 1016 may be longer than distal leg 1014.

According to an implementation, systems described herein may include an assembly of a substrate including at least two anchors; an electronic device mounted to the substrate; a heat sink with a plate having a plurality of fins extending from a first surface of the plate, the fins defining a channel along the first surface; and a retaining clip. The retaining clip may include a middle section with a first end section and a second end section on either side of the middle section. The middle section may be configured to fit with the channel and engage the first surface of the heat sink to hold a second surface of the heat sink in thermal contact with a surface of the electronic device. The middle section may further include a portion extending in a direction parallel to the plurality of fins, above the first surface, to limit rotation of the heat sink about a first axis that extends along a bottom of the channel on the first surface. Each of the first and second end sections may include a pivot end between the middle section and one of the first end section or the second end section; a distal end to engage one of the at least two anchors; a first leg adjacent to the distal end; a second leg adjacent to a pivot end; and a bend between the first leg and the second leg, the bend forming an acute angle that opens toward the substrate when the distal end is engaged with one of the at least two anchors.

According to another implementation, a retaining clip is provided for use with a heat sink. The heat sink has a flat bottom surface in heat conducting engagement with an electronic device and fins extending from a top surface of the heat sink, the fins defining a channel. The retainer clip may include a middle section with a first end section and a second end section on either side of the middle section. The middle section fits within the channel and engages the heat sink to hold the bottom surface against the electronic device. The middle section may further include a portion extending above the top surface, within the channel, to limit rotation of the heat sink when the retaining clip is installed. Each of the first and second end sections include a pivot end adjacent to the middle section, a distal end to engage an anchor, a first leg adjacent to the distal end, a second leg adjacent to a pivot end, and a bend between the first leg and the second leg, the bend located to form a moment arm from the pivot end.

The foregoing description of implementations provides illustration and description, but is not intended to be exhaustive or to limit the invention to the precise form disclosed. References to particular directions, axes, and orientations used herein are for illustrative purposes and are not intended to be limiting. Modifications and variations are possible in light of the above teachings or may be acquired from practice of the invention. For example, the foregoing figures refer to an electronic device, such as an integrated circuit (IC) chip package, to which a heat sink is attached with a retaining clip to form a heat sink assembly. However, implementations described herein are is not limited to heat sinks used with electronic circuits in computer assemblies, but may be used with any apparatus having a heat emitting device and a heat sink.

Use of ordinal terms such as "first," "second," "third," etc., in the claims to modify a claim element does not by itself connote any priority, precedence, or order of one claim element over another, the temporal order in which acts of a method are performed, the temporal order in which instructions executed by a device are performed, etc., but are used merely as labels to distinguish one claim element having a certain name from another element having a same name (but for use of the ordinal term) to distinguish the claim elements.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

In the preceding specification, various preferred embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:

1. An assembly, comprising:
a substrate including at least two anchors;
an electronic device mounted to the substrate;
a heat sink with a plate having a plurality of fins extending from a first surface of the plate, the fins defining a channel along the first surface; and
a retaining clip, the retaining clip including a middle section and a first end section and a second end section on either side of the middle section,
the middle section fitting within the channel and engaging the first surface of the heat sink to hold a second surface of the heat sink in thermal contact with the electronic device, wherein the middle section further includes a portion extending above the first surface, within the channel, to limit rotation of the heat sink,
each of the first and second end sections including:
a pivot end between the middle section and one of the first end section or the second end section,
a distal end to engage one of the at least two anchors,
a first leg adjacent to the distal end,
a second leg adjacent to a pivot end, and
a bend between the first leg and the second leg, the bend forming an acute angle that opens toward the substrate when the distal end is engaged with one of the at least two anchors, the bend being located to form a moment arm from the pivot end to the bend, wherein the moment arm is longer than a distance between the distal end and the pivot end.

2. The assembly of claim 1, wherein the retaining clip comprises a metal wire.

3. The assembly of claim 1, wherein the substrate is a printed circuit board.

4. The assembly of claim 1, wherein the middle section further comprises at least one contact leg extending along the first surface of the heat sink within the channel.

5. The assembly of claim 1, wherein the retaining clip applies at least 2.5 kilogram-force against the heat sink when the distal ends of the first and second end sections are coupled to the at least two anchors.

6. The assembly of claim 1, wherein the first leg, the second leg, and the bend of the first end section define a plane that is orthogonal to an axis that extends along a bottom of the channel.

7. The assembly of claim 1, wherein the assembly comprises exactly two anchors.

8. The assembly of claim 7, wherein the two anchors are located on the substrate near opposite corners of the plate.

9. The assembly of claim 1, wherein the middle section of the retaining clip is installed in the channel parallel to one of the plurality of fins, and wherein the first end section is perpendicular to the one of the plurality of fins.

10. The assembly of claim 1, wherein the middle section of the retaining clip is installed in the channel perpendicular to one of the plurality of fins, and wherein the first end section is parallel to the one of the plurality of fins.

11. The assembly of claim 1, wherein a height of the retaining clip exceeds a height of the plurality of fins when each of the distal end is engaged with a respective one of the at least two anchors.

12. A retaining clip for use with a heat sink, the heat sink having a flat bottom surface and heat conducting engagement with an electronic device upper surface and a plurality of fins extending from a top surface of the heat sink and defining a channel, the retainer clip comprising:
   a middle section to fit within the channel and engage the heat sink to hold the bottom surface against the upper surface, wherein the middle section further includes a portion extending above the top surface, within the channel, to limit rotation of the heat sink; and
   a first end section and a second end section on either side of the middle section, each of the first and second end sections including:
      a pivot end between the middle section and one of the first end section or the second end section,
      a distal end to engage an anchor,
      a first leg adjacent to the distal end,
      a second leg adjacent to a pivot end, and
      a bend between the first leg and the second leg, the bend being located to form a moment arm from the pivot end to the bend, wherein the moment arm is longer than a distance between the distal end and the pivot end.

13. The retaining clip of claim 12, wherein the retaining clip comprises a single steel wire.

14. The retaining clip of claim 12, wherein the middle section further comprises at least one contact leg to extend along the top surface of the heat sink within the channel.

15. The retaining clip of claim 12, wherein the first end section and the second end section are perpendicular to the middle section.

16. The retaining clip of claim 12, wherein the first end section and the second end section are substantially on opposite sides of a vertical plane defined by the middle section.

17. The retaining clip of claim 12, wherein the retaining clip comprises exactly two distal ends.

18. The retaining clip of claim 12, wherein a height of each of the first and second end sections is higher than the height of the middle section when the distal ends of the first and second end sections are coupled to the anchors.

19. The retaining clip of claim 12, wherein the first leg, the second leg, and the bend of the first end section define a plane that is orthogonal to an axis that extends along a bottom of the channel, when the middle section is installed in the channel.

20. The retaining clip of claim 12, wherein the retaining clip comprises a plastic material.

* * * * *